(12) United States Patent
Terhune, IV et al.

(10) Patent No.: US 8,597,035 B1
(45) Date of Patent: Dec. 3, 2013

(54) ELECTRICAL CONNECTOR WITH LOW COST LOADING MECHANISM

(75) Inventors: Albert Harvey Terhune, IV, Chandler, AZ (US); Wei-Te Chung, San Jose, CA (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/542,680

(22) Filed: Jul. 6, 2012

(51) Int. Cl.
*H01R 12/00* (2006.01)

(52) U.S. Cl.
USPC .............................. 439/73; 439/331

(58) Field of Classification Search
USPC ........................... 439/73, 266, 331
See application file for complete search history.

(56) References Cited

U.S. PATENT DOCUMENTS

| 7,878,835 | B2 | 2/2011 | Fan |
| 8,162,685 | B2 | 4/2012 | Tang et al. |
| 8,342,871 | B2 * | 1/2013 | Gattuso .......................... 439/331 |
| 8,403,681 | B2 * | 3/2013 | Chien et al. ..................... 439/66 |
| 8,460,012 | B2 * | 6/2013 | Zhou et al. ...................... 439/73 |

* cited by examiner

*Primary Examiner* — Khiem Nguyen
(74) *Attorney, Agent, or Firm* — Wei Te Chung; Ming Chieh Chang

(57) ABSTRACT

An electrical connector includes a reinforcement member including a pair of tabs having an outer curved surface; a load plate including a first side, a second side opposite to the first side and a third side connecting the first side and the second side at a front location while the first side and the second side are disconnected at a rear location; a lever including a driving portion and a shaft portion running through the reinforcement member and the load plate and is rotatably connected to rear ends of the first side and the second side. The shaft portion of the lever guides along the outer curved surface of the frame so as to move the load plate forwardly or backwardly.

20 Claims, 7 Drawing Sheets

ELECTRICAL CONNECTOR WITH LOW COST LOADING MECHANISM

BACKGROUND OF THE INVENTION

1. Field of the Invention

The present disclosure relates to an electrical connector for connecting an IC package with a circuit board, and particularly to an electrical connector including a low cost loading mechanism.

2. Description of Related Art

U.S. Pat. No. 8,162,685 issued to Tang, et al. on Apr. 24, 2012 discloses an electrical connector for interconnecting a chip module to a circuit board. The electrical connector comprises a retainer mounted on the circuit board; a load plate in a rectangular shape covering the chip module; a lever running through the retainer and the load plate for controlling the forward and backward rotation of the load plate. The load plate moves forwardly and then locks onto a screw of the circuit board so as to fix the chip module onto the circuit board. The load plate moves backwardly and then releases from the circuit board so as to remove the chip module from the circuit board.

However, the structure of the load plate and the retainer is complex and an abundant of material may be often removed and thereby wasted in manufacturing. This will directly result in much more additional costs to the overall manufacturing of the electrical connector.

In view of the above, an improved electrical connector is desired to overcome the problems mentioned above.

SUMMARY OF THE INVENTION

Accordingly, an object of the present disclosure is to provide an electrical connector including a low cost loading mechanism.

According to one aspect of the present disclosure, an electrical connector is provided for electrically connecting an IC package to a circuit board. The electrical connector comprises a housing for being mounted on the circuit board; a reinforcement member for being mounted on the circuit board and located beside the housing; a load plate rotatably coving the housing, wherein the load plate includes a first side, a second side opposite to the first side and a third side bridging the first side and the second side at a front location while the first side and the second side are disconnected at a rear location opposite to the front location; a lever comprising a driving portion and a shaft portion, wherein the shaft portion runs through the reinforcement member and the load plate and is rotatably connected to rear ends of the first side and the second side. The reinforcement member comprises at least one tab having an outer curved surface, wherein the shaft portion of the lever guides along the outer curved surface so as to move the load plate forwardly and backwardly.

Other objects, advantages and novel features of the disclosure will become more apparent from the following detailed description when taken in conjunction with the accompanying drawings, in which:

DETAILED DESCRIPTION OF THE INVENTION

Figure 1:
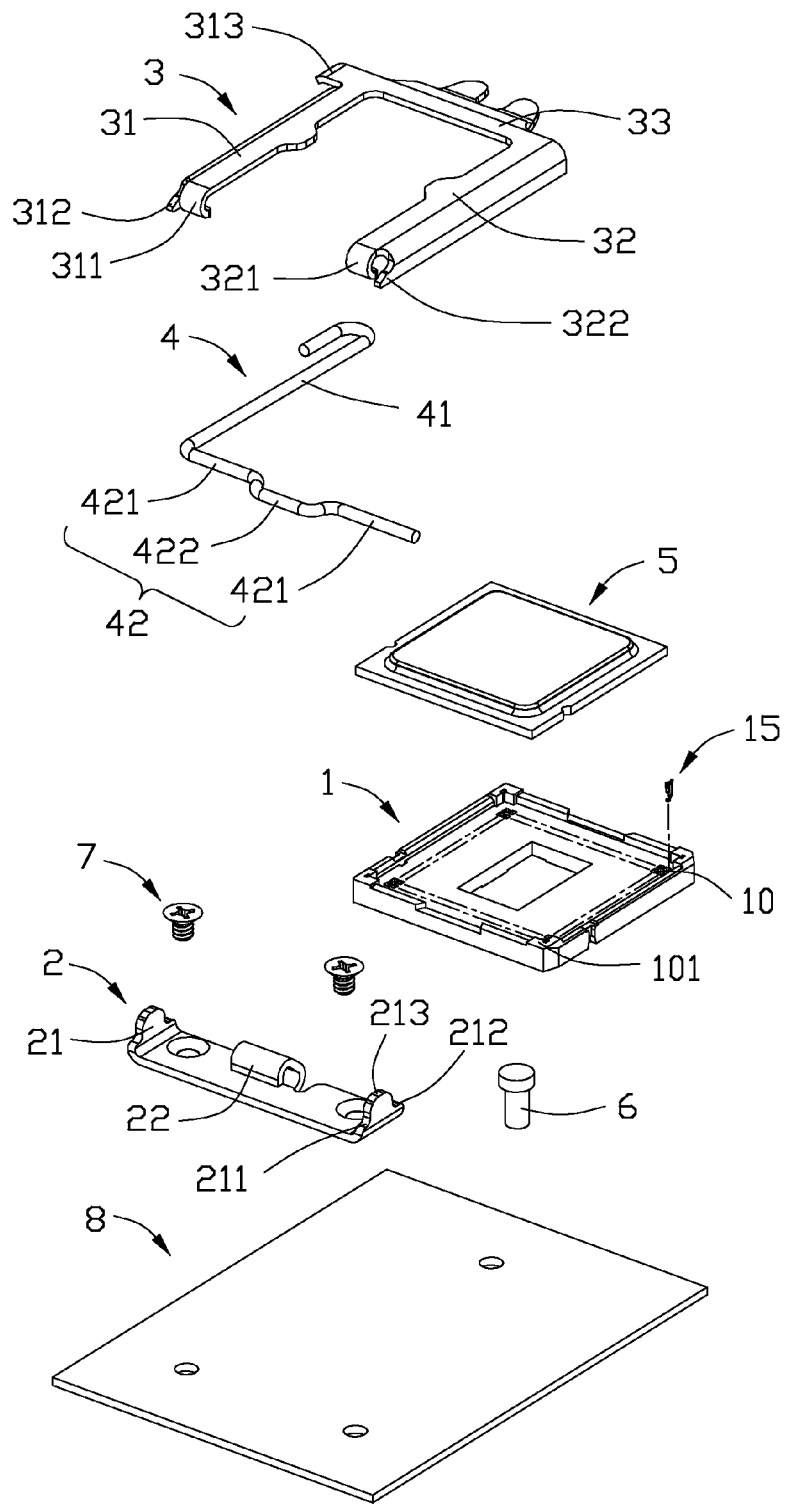
FIG. 1 is an exploded, perspective view of an electrical connector and an IC package in accordance with a preferred embodiment of the present disclosure.
Figure 2:
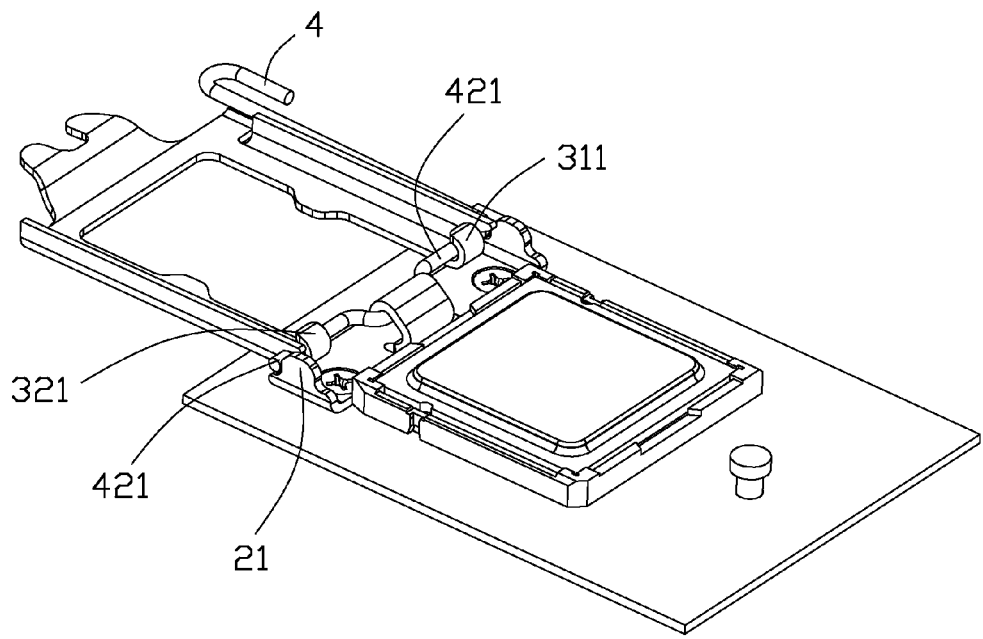
FIG. 2 is an assembled, perspective view of the electrical connector and the IC package as shown in FIG. 1, wherein the load plate and the lever are opened.
Figure 3:
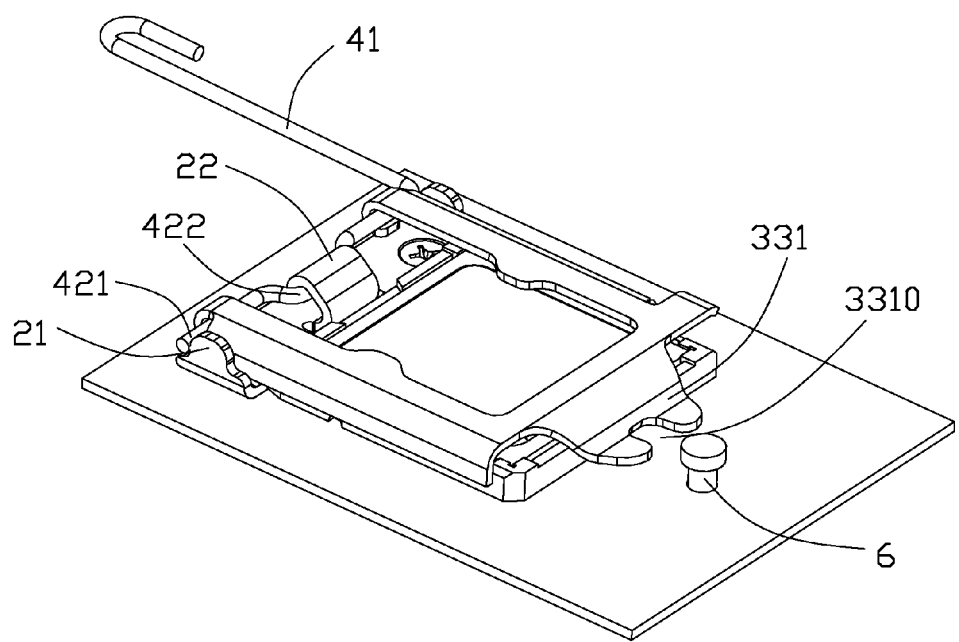
FIG. 3 is an assembled, perspective view of the electrical connector and the IC package as shown in FIG. 1, wherein the load plate is coving the housing while the lever is opened.
Figure 4:
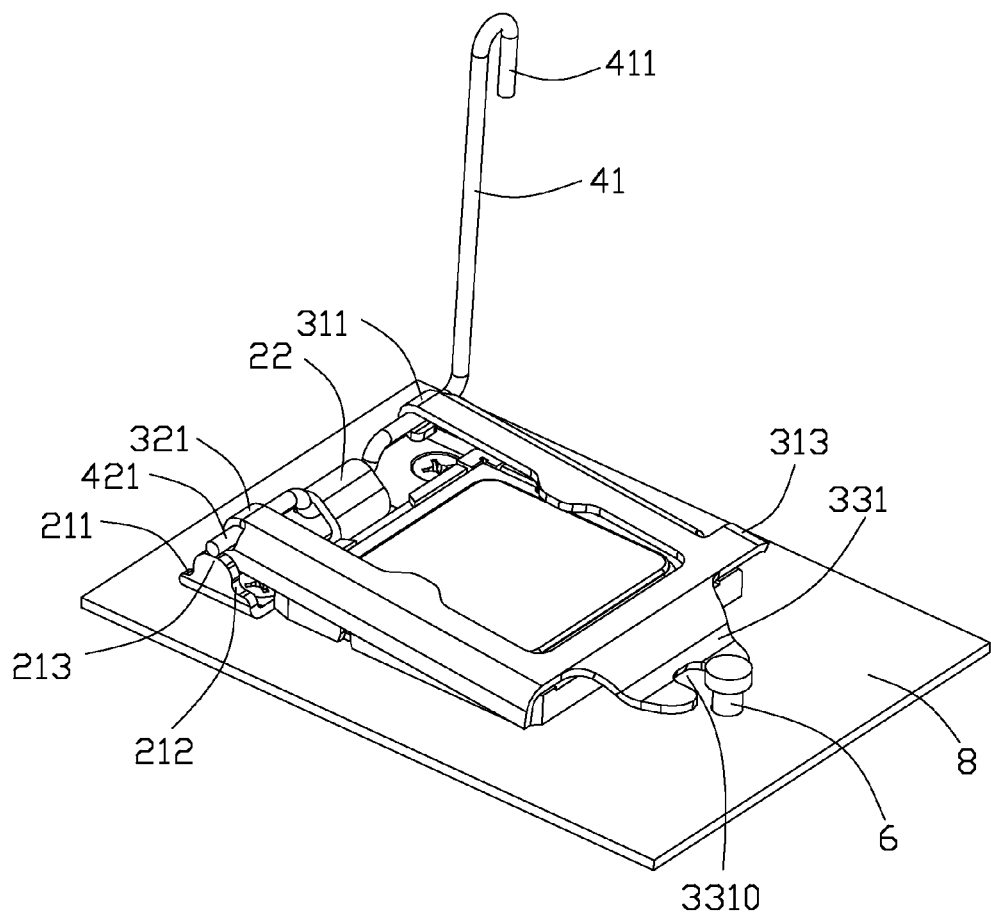
FIG. 4 is an assembled, perspective view of the electrical connector and the IC package as shown in FIG. 1, wherein the lever moves the load plate forwardly.
Figure 5:
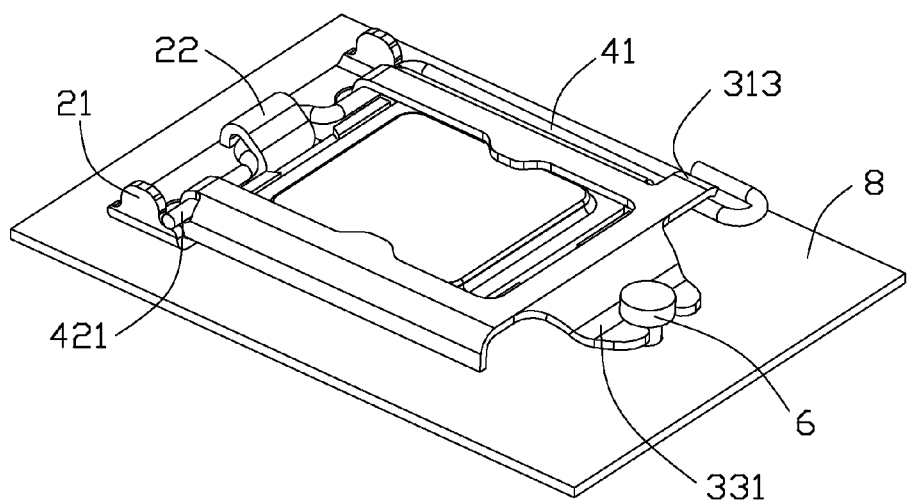
FIG. 5 is an assembled, perspective view of the electrical connector and the IC package as shown in FIG. 1, wherein the load plate and the lever are closed.
Figure 6:
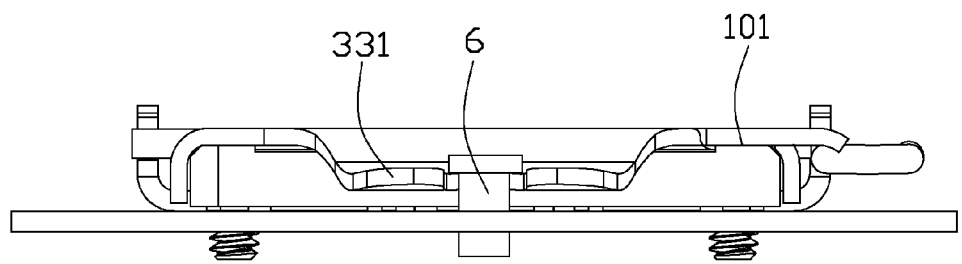
FIG. 6 is a front view of the electrical connector and the IC package as shown in FIG. 1.

Reference will now be made to the drawings to describe the present disclosure in detail. Referring to FIG. 1 to FIG. 6, an electrical connector for electrically connecting an IC package 5 to a circuit board 8 includes a housing 1 with a plurality of contacts 15 therein, a reinforcement member 2 located beside the housing 1, a load plate 3 rotatably coving the housing 1, a lever 4 running through the reinforcement member 2 and the load plate 3, and a shoulder screw or retaining member 6 fastened to the circuit board 8 for positioning the load plate 3 in a closed position.

The housing 1 is mounted on the circuit board 8 and comprises a plurality of receiving holes 10 for receiving the contacts 15. A plurality of standoffs 101 are situated at four corners of the housing 1 and each standoff 101 extends upwardly beyond a top surface of the housing 1 for supporting the load plate 3. The reinforcement member 2 is located at one side of the housing 1. The reinforcement member 2 is fixed on the circuit board 8 by a pair of fixing members 7, such as screws. The reinforcement member 2 is metallic and comprises a flat base 20, a pair of tabs 21 bent upwardly at two opposite sides of the base 20 and a connecting portion 22 wrapped upwardly and backwardly from a middle section of the base 20. Each of the tabs 21 has an outer curved surface which further comprises a first curved surface 211, a second curved surface 212 opposite to the first curved surface 211 and a peak 213 between the first curved surface 211 and the second curved surface 212. Ends of the first curved surface 211 and the second curved surface 212 are substantially horizontal and the end of the first curved surface 211 is lower than the end of the second curved surface 212 for installing the lever 4 to the reinforcement member 2 via the first curved surface 211.

The load plate 3 is also metallic and comprises a first side 31, a second side 32 opposite to the first side 31, and a third side 33 bridging the first side 31 and the second side 32 at a front location. The first side 31 and the second side 32 are disconnected at a rear location opposite to the front location. The first side 31 comprises a first hinge member 311 and a first tail 312 located at an outer side of the first hinge member 311. The first hinge member 311 is bent downwardly from a rear end of the first side 31 while the first tail 312 extends horizontally and further beyond the first hinge member 311 along a front-to-back direction. The second side 32 is substantially symmetrical with respect to the first side 31 except that the first side 31 is provided with a captive hook 313 for pressing against the lever 4 in the closed position. The second side 32 includes a second hinge member 321 and a second tail 322 located at an outer side of the second hinge member 321. The second hinge member 321 is bent downwardly from a rear end of the second side 32 while the second tail 322 extends horizontally and further beyond the second hinge member 321 along the front-to-back direction. The third side 33 of the load plate 3 comprises a positioning tongue 331 defining a U-shaped hole 3310 for mating with the shoulder screw 6.

The lever 4 is L-shaped and comprises a driving portion 41 and a shaft portion 42 perpendicular to the driving portion 41. The driving portion 41 comprises a handling portion 411 bent outwardly therefrom for being operated by a user. The shaft portion 42 comprises two straight or cam sections 421 and a curved or center section 422 between the two straight sections 421.

Particularly referring to FIG. 2 to FIG. 5, in assembling, the housing 1 is mounted on the circuit board 8. The reinforcement member 2 is then fixed on the circuit board 8 by the fixing members 7. The load plate 3 is jointed to the reinforcement member 2 via the lever 4. The two straight sections 421 of the shaft portion 42 are rotatably connected with the first and the second hinge members 311, 321 and located upon the first and the second tails 312, 322 while the curved section 422 is engaged with the connecting portion 22. The shoulder screw 6 is fixed onto the circuit board 8 and is located beside the housing 1 and opposite to the reinforcement member 2.

In operation, the handling portion 411 of the driving portion 41 is levered by the user to move the load plate 3 forwardly and backwardly. Before installing the IC package 5 to the electrical connector, the lever 4 and the load plate 3 are opened. During installing the IC package 5 to the electrical connector, firstly, the IC package 5 is put into the housing 1 and then the load plate 3 is driven to cover the housing 1. At this time, the bottom of the load plate 3 touches the standoffs 101 of the housing 1 to support the load plate 3 and prevent the load plate 3 from damaging the circuit board 8. Secondly, the driving portion 41 is pressed, the two straight sections 421 slide along the first curved surfaces 211, and then get over the peak 213 and ultimately engage against the second curved surfaces 212. As a result, the reaction force between the tabs 21 and the straight sections 421 pushes the load plate 3 forwardly, and the straight sections 421 also apply a downward force upon the first and the second tails 312, 322 of the load plate 3 to move the load plate 3 downwardly. As the driving portion 41 rotates downwardly, the load plate 3 moves forwardly and towards the shoulder screw 6. Finally, when the end of the driving portion 41 engages onto the captive hook 313, the U-shaped hole 3310 of the tongue 331 engages with the shoulder screw 6. According to the above described embodiment of the present disclosure, an electrical connector with a low cost loading mechanism is provided. The structure of load plate 3 and the reinforcement member 2 are simple and easy to manufacture and the movement of the load plate 3 is easy to operate.

Figure 7:
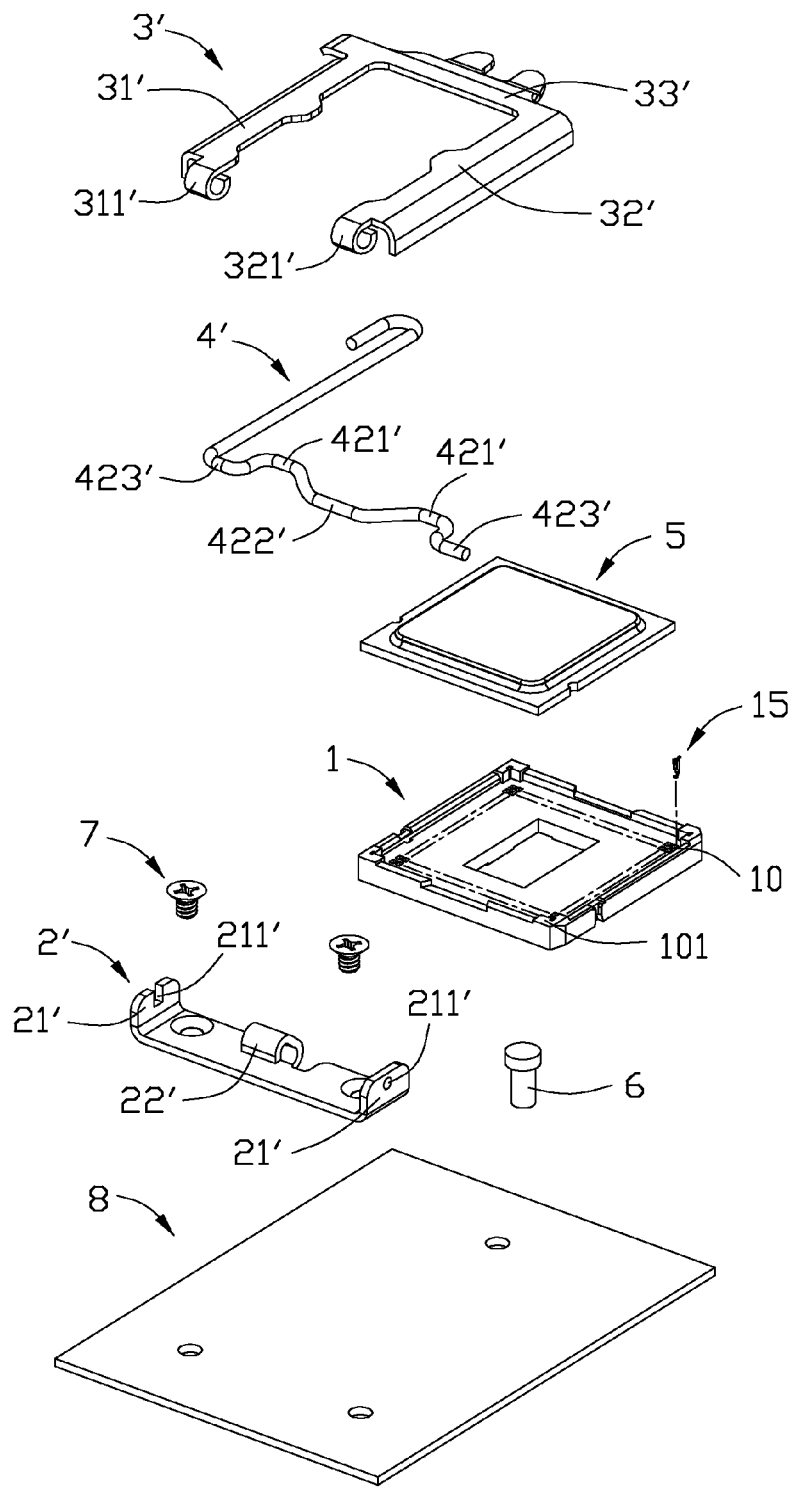
FIG. 7 is an exploded, perspective view of an electrical connector and an IC package in accordance with another preferred embodiment of the present disclosure.

FIG. 7 shows another embodiment of the invention similar to what is shown in FIG. 1, wherein the lever 4' further includes a pair of fixing sections 423' located by two outer sides of the two straight sections or cam sections 421' for being held in the corresponding retaining hole/groove 211' in the tab 21' wherein the fixing sections 423' are aligned with the center section 422' in the transverse direction and the center section 422' is retained in the connecting portion 22'. The load plate 3' essentially consists of the first side 31', the second side 32' and the third side 33' wherein the first side 31' and the second side 32' define the hinge member 311' and 312' through which the corresponding straight sections 421' extend, respectively.

Compared with what is disclosed in the U.S. Pat. No. 8,162,685 which uses a center single cam section to actuate the load plate to move/lock, the instant invention of both embodiments use two spaced cam sections 421 or 421' to urge the load plate to move with regard to the housing 1 and the shoulder screw 6 with stabler movement. In other words, the instant invention uses double operation regions of the crank structure which is superior to the single operation region of the crank structure disclosed in the aforementioned U.S. Pat. No. 8,162,685. Compared with the first embodiment using one stationary supporting region, i.e., the center section 422 retained in the connecting portion 22, the second embodiment provides three stationary supporting regions, i.e., the two fixing sections 423' retained in the two side tabs 21' and the center section 422' retained in the connecting portion 22' to have the two cam sections 421' rotate about an axis defined by the two fixing section 423' and the center section 422', thus facilitating operatability thereof. Understandably, in the second embodiment, the center section 422' and the two fixing sections 423 commonly define an immovable axis which is offset from the moveable axis defined by the two cam sections 421', compared with the immovable axis defined only two the center section 422 and the offset moveable axis defined by the two cam sections 421 in the first embodiment. It is understood that in both embodiments, the engagement between the center section 422/422' and the connecting portion 22/22' not only retains the lever 4/4' to the reinforcement member 2/2' but also restricting relative movement therebetween in the axial/transverse direction. Anyway, the restriction of relative movement along the transverse direction may be replaced by a clip fastening to a distal end of the outer fixing section 423' in the second embodiment.

Anyhow, both embodiments of the instant invention use the so-called U-shaped load plate with an opening in one side instead of the closed type rectangular load plate disclosed in the aforementioned U.S. Pat. No. 8,162,685 to allow alternately back to back arranging the load plates during stamping the corresponding load plates from a raw sheet metal thus efficiently reducing waste, compared with the closed type rectangular load plate in which the material in the rectangular opening is wasted after manufacturing/stamping. It is also noted that on one hand, the dimension of the cam section 421' along the transverse direction should be large enough for efficiently catching the corresponding hinge member 311'/321'; On the other hand, the dimension of the corresponding hinge member 311' and 321' along the transverse direction should not be too large as to significantly narrow the space therebetween and jeopardize the aforementioned alternate arrangement of the load plates in a raw sheet metal. In the second embodiment, the distance/space between the two hinge member 311' and 321' is not less than two thirds of the whole lengthwise of the side 33' in the transverse direction. Also in the second embodiment, the cam section 421' extends along the transverse direction with a distance/dimension not less than one eight of the whole length of the shaft portion in the transverse direction. It is also noted in the second embodiment, to meet the aforementioned considerations, the cam section 421' is connected to the fixing section 423' with a steep link while connecting to the center section 422' with a minor inclined link. Notably, forces imposed upon the load plate around the first end of the housing occurs only around the positioning tongue 331, and those around the second of the housing occur only around the hinge members 311, 321, thus commonly resulting in force application essentially by three points commonly defining an isosceles triangle thereof. This isosceles triangular arrangement for locking the load plate 3 in position is superior to the linear arrangement for locking the corresponding load plate disclosed in the U.S. Pat. No. 8,162,685. This isosceles triangle is similar to another isosceles triangle defined by retention between the retaining member and the printed circuit board and those between the reinforcement member and the printed circuit board.

While preferred embodiments in accordance with the present disclosure has been shown and described, equivalent modifications and changes known to persons skilled in the art according to the spirit of the present disclosure are considered within the scope of the present disclosure as defined in the appended claims.

What is claimed is:

1. An electrical connector for electrically connecting an IC package to a circuit board comprising:
a housing for being mounted on the circuit board;
a reinforcement member located beside the housing;
a load plate rotatably mounted around the reinforcement member and rotatably covering the housing, the load plate comprising a first side, a second side opposite to the first side and a third side connecting the first side and the second side, the third side connecting front ends of the first side and the second side, each rear end of the first side and the second side opposite to the front end comprising a hinge member; and
a lever rotatably connected to the hinge members at the rear ends of the first side and the second side, the lever comprising a driving portion and a shaft portion running through the reinforcement member and the load plate; wherein
the reinforcement member comprises at least one tab having an outer curved surface and a connecting portion for engaging with the shaft portion to restrict the lever on the reinforcement member; and wherein
the shaft portion of the lever guides along the outer curved surface of the tab so as to move the load plate forwardly and backwardly.

2. The electrical connector as claimed in claim 1, wherein the outer curved surface of the tab comprises a first curved surface, a second curved surface opposite to the first curved surface and a peak between the first curved surface and the second curved surface.

3. The electrical connector as claimed in claim 2, wherein each of the first curved surface and the second curved surface comprises an end substantially extending horizontally and the end of the first curved surface is lower than the end of the second curved surface.

4. The electrical connector as claimed in claim 1, wherein the frame comprises a pair of tabs located at two sides of the frame.

5. The electrical connector as claimed in claim 4, wherein the shaft portion of the lever comprises two straight sections situated at two sides of the shaft portion and a curved section connecting the two straight sections; and wherein the two straight sections and the curved section are non-collinear and the curved section of the lever engages with the connecting portion of the frame while the two straight sections rotatably connect the hinge member and extend onto the tabs of the frame.

6. The electrical connector as claimed in claim 5, wherein each of the rear ends of the first side and the second side comprises a tail extending horizontally and further beyond the corresponding hinge member along the front-to-back direction, wherein the straight section is located on the tail, so that the straight section is able to apply a downward force upon the tail of the load plate to move the load plate downwardly.

7. The electrical connector as claimed in claim 1, wherein the rear ends of the first side and the second side are disconnected.

8. The electrical connector as claimed in claim 1, wherein the third side of the load plate comprises a positioning tongue defining a U-shaped hole, wherein the electrical connector comprises a shoulder screw engaging with the U-shaped hole to fix the load plate on the circuit board in a closed position.

9. The electrical connector as claimed in claim 1, wherein the housing comprises a plurality of standoffs extending upwardly beyond a top surface, when the load plate moves forwardly, the bottom of the load plate touches the standoffs to guide the load plate and prevent the load plate from damaging the circuit board.

10. An electrical connector for electrically connecting an IC package to a circuit board comprising:
a housing for being mounted on the circuit board;
a reinforcement member located beside the housing;
a load plate rotatably mounted around the reinforcement member and rotatably covering the housing, the load plate comprising a first side, a second side opposite to the first side and a third side connecting the first side and the second side, the third side connecting front ends of the first side and the second side, each rear end of the first side and the second side opposite to the front end comprising a hinge member;
a lever rotatably connected to the hinge members at the rear ends of the first side and the second side, the lever comprising a driving portion and a shaft portion running through the reinforcement member and the load plate; wherein
the shaft portion comprises two straight sections situated at two sides of the shaft portion and a curved section connecting the two straight sections, and wherein the two straight sections and the curved section are non-collinear and the curved section of the lever rotatably restrict to the reinforcement member while the two straight sections rotatably connect the hinge member and move forwardly and backwardly.

11. The electrical connector as claimed in claim 10, wherein the reinforcement member comprises a flat base and a pair of tabs having an outer curved surface bent upwardly at two sides of the base; and wherein the two straight sections of the shaft portion of the lever guides along the outer curved surface of the tabs so as to move the load plate forwardly and backwardly.

12. The electrical connector as claimed in claim 11, wherein the reinforcement member comprise a connecting portion extending from a middle section of the base; and wherein the curved section of the lever is engaged with the connecting portion to restrict the lever on the reinforcement member.

13. The electrical connector as claimed in claim 10, wherein the rear ends of the first side and the second side are disconnected.

14. The electrical connector as claimed in claim 10, wherein each of the rear ends of the first side and the second side comprises a tail extending horizontally and further beyond the corresponding hinge member along the front-to-back direction, wherein the straight section is located on the tail, so that the straight section is able to apply a downward force upon the tail of the load plate to move the load plate downwardly.

15. An electrical connector for use with an electronic package and mounting to a printed circuit board, comprising:
an insulative housing defining opposite first and second ends along a lengthwise direction with therebetween a receiving cavity in an upper face thereof for receiving said electronic package;

a plurality of contacts disposed in the housing with contacting sections exposed in the receiving cavity;

a retaining member located by a middle region of the first end;

a reinforcement member located by the second end, and defining two opposite tabs at two ends in a transverse direction perpendicular to said lengthwise direction;

a lever defining a crank structure with an immovable axis fastened to the reinforcement member and defined by at least a pair of outer fixing sections, and a movable axis being rotatable relative to the immovable axis, said moveable axis being defined by a pair of cam sections spaced from each other in the transverse direction and located inside of and adjacent to the pair of corresponding fixing sections, respectively; and a load plate essentially configured with a U-shape defining a pair of lengthwise sides extending along the lengthwise direction and connected by a transverse side extending along the transverse direction, said pair of lengthwise sides being equipped with a pair of respective hinge members at corresponding distal ends opposite to said transverse side, said pair of hinge members being space from each other with a distance along the transverse direction and grasping the pair of corresponding cam sections, respectively, a positioning tongue formed on the transverse side in alignment with the retaining member in the lengthwise direction; wherein the load plate is rotatable relative to the housing with a pivot around the second end, and via rotational movement of the lever about the immovable axis, the positioning tongue can be locked to or released from the retaining member.

16. The electrical connector as claimed in claim 15, wherein each of the cam sections extends along the transverse direction with a distance around one eight or more of a whole dimension of said crank structure in said transverse direction.

17. The electrical connector as claimed in claim 15, wherein a distance between the spaced hinge members is ranged between one fourth and two thirds of a whole dimension of the transverse side along said transverse direction.

18. The electrical connector as claimed in claim 15, wherein the immovable axis is further defined by a center section between the pair of cam sections under condition that a link structure between the cam section and the corresponding outer fixing section is steeper than another link structure between said cam section and the center section.

19. The electrical connector as claimed in claim 15, wherein forces imposed upon the load plate around the first end of the housing occurs only around the positioning tongue, and those around the second of the housing occur only around the hinge members, thus commonly resulting in force application essentially by three points commonly defining an isosceles triangle thereof.

20. The electrical connector as claimed in claim 19, wherein the retaining member and the reinforcement member are both mounted to the printed circuit board on which the housing is seated under condition that retention between the retaining member and the printed circuit board and those between the reinforcement member and the printed circuit board occur at three points commonly defining another isosceles triangle similar to said isosceles triangle.

* * * * *